United States Patent
Boukhris et al.

(10) Patent No.: US 12,146,916 B2
(45) Date of Patent: Nov. 19, 2024

(54) METHOD FOR CONTROLLING THE SPEED OF BRUSHLESS MOTORS

(71) Applicant: VITESCO TECHNOLOGIES GmbH, Regensburg (DE)

(72) Inventors: Karim Boukhris, Toulouse (FR); Nassim Mediouni, Toulouse (FR)

(73) Assignee: VITESCO TECHNOLOGIES GMBH, Regensburg (DE)

( * ) Notice: Subject to any disclaimer, the term of this patent is extended or adjusted under 35 U.S.C. 154(b) by 191 days.

(21) Appl. No.: 17/642,275

(22) PCT Filed: Sep. 11, 2020

(86) PCT No.: PCT/EP2020/075522
§ 371 (c)(1),
(2) Date: Mar. 11, 2022

(87) PCT Pub. No.: WO2021/048388
PCT Pub. Date: Mar. 18, 2021

(65) Prior Publication Data
US 2022/0299568 A1    Sep. 22, 2022

(30) Foreign Application Priority Data
Sep. 12, 2019    (FR) ........................ 1910087

(51) Int. Cl.
*G01R 31/34*    (2020.01)
*G01R 1/20*    (2006.01)
(Continued)

(52) U.S. Cl.
CPC ........... *G01R 31/343* (2013.01); *G01R 1/203* (2013.01); *G01R 19/0084* (2013.01); *H02P 23/14* (2013.01)

(58) Field of Classification Search
CPC .. G01R 31/343; G01R 1/203; G01R 19/0084; H02P 23/14
See application file for complete search history.

(56) References Cited

U.S. PATENT DOCUMENTS

| | | | |
|---|---|---|---|
| 11,099,216 B2 | 8/2021 | Panine | |
| 2015/0155806 A1* | 6/2015 | Tsukamoto | H02P 6/21 318/400.11 |
| 2019/0339304 A1 | 11/2019 | Panine | |

FOREIGN PATENT DOCUMENTS

| | | |
|---|---|---|
| CN | 101715560 A | 5/2010 |
| CN | 208461676 U | 2/2019 |

(Continued)

OTHER PUBLICATIONS

Pacha et al. "HW issues of current sensing by DC-link shunt resistor", 2018 Elektro, IEEE, May 21, 2018, pp. 1-5.*

(Continued)

*Primary Examiner* — Zoheb S Imtiaz
(74) *Attorney, Agent, or Firm* — NIXON & VANDERHYE

(57) ABSTRACT

Method for determining the voltage UL generated by the inductive part of a measuring resistor present in an electronic circuit including a signal generator, at least one stator winding connected to the signal generator and to the measuring resistor and a differential amplifier for the voltage across the terminals of the measuring resistor, the method including: a step of energizing the electronic circuit for a predetermined period of time t; a step of measuring the voltage UT across the terminals of the measuring resistor at the end of the energizing step; a step of determining the voltage UR generated by the resistive part of the measuring resistor at the end of the energizing step; and a step of (Continued)

determining the voltage UL generated by the inductive part of the measuring resistor as a function of the voltage UT and the voltage UR.

20 Claims, 1 Drawing Sheet

(51) Int. Cl.
*G01R 19/00* (2006.01)
*H02P 23/14* (2006.01)

(56) References Cited

FOREIGN PATENT DOCUMENTS

| | | |
|---|---|---|
| CN | 109917179 A | 6/2019 |
| JP | 2015-152532 | 8/2015 |
| WO | 2017/149359 | 9/2017 |

OTHER PUBLICATIONS

Office Action issued in Chinese Patent Application No. 202080063883.4 dated Aug. 3, 2023.
International Search Report for PCT/EP2020/075522 mailed Nov. 18, 2020, 4 pages.
Written Opinion of the ISA for PCT/EP2020/075522 mailed Nov. 18, 2020, 5 pages.

* cited by examiner

[Fig. 1]
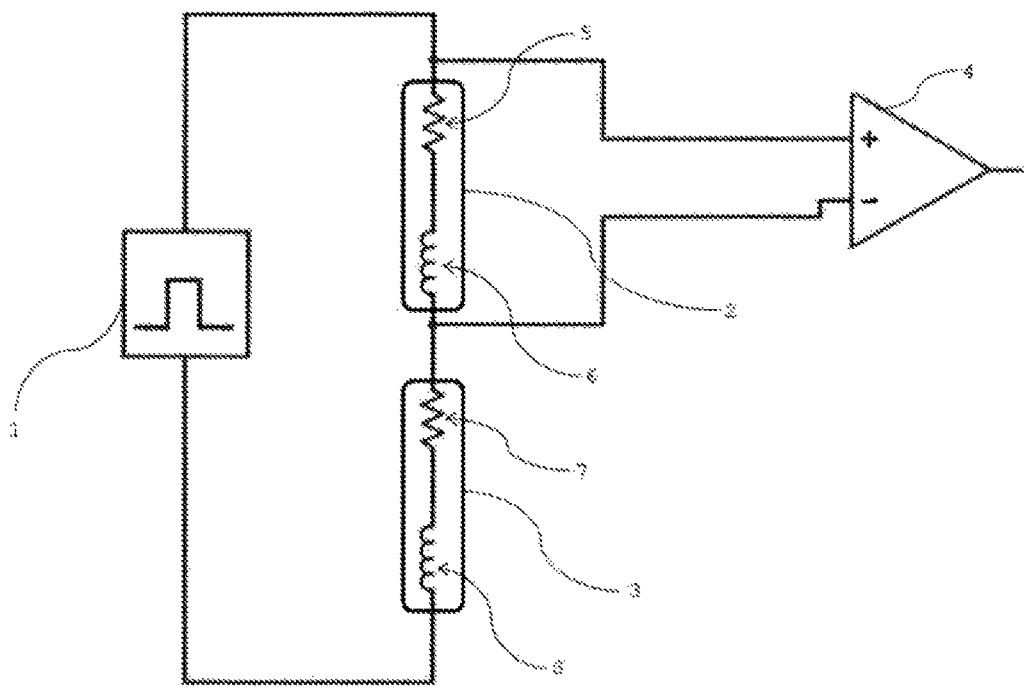
[Fig. 2]
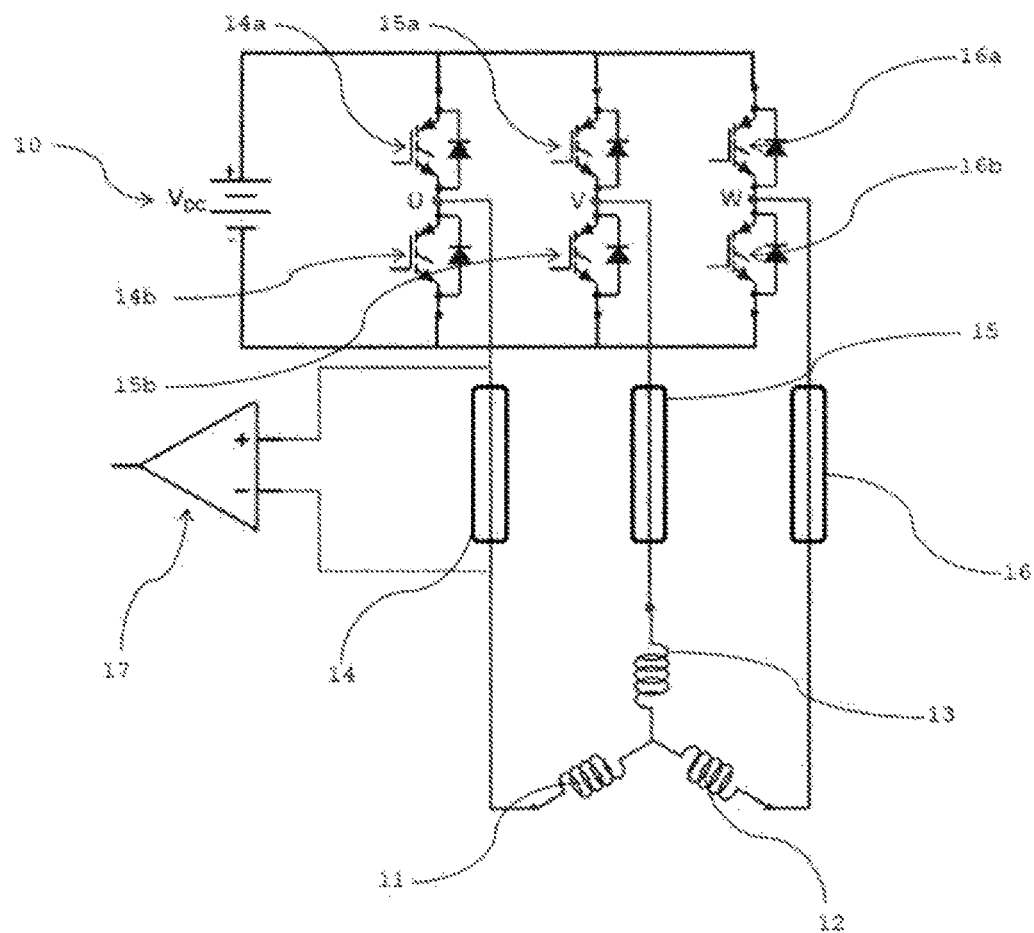

METHOD FOR CONTROLLING THE SPEED OF BRUSHLESS MOTORS

This application is the U.S. national phase of International Application No. PCT/EP2020/075522 filed Sep. 11, 2020 which designated the U.S. and claims priority to FR Patent Application No. 1910087 filed Sep. 12, 2019, the entire contents of each of which are hereby incorporated by reference.

FIELD OF THE INVENTION

The present invention relates to a method for controlling the speed of a brushless electric motor and more particularly to a method for determining the voltage generated by the inductive part of a measuring resistor present in an electronic circuit of a motor.

PRIOR ART

Nowadays, brushless motors are widely used in industry because they have many advantages over DC motors. They have better performance and increased reliability. The brushless motor is particularly useful in motor vehicles comprising a combustion engine. The brushless motor has a very good power-to-weight ratio and replaces the DC motor especially when mass or rotational speed are important criteria.

Brushless motors are synchronous and usually three-phase AC electrical machines. It is necessary to control the speed of a motor precisely, and this is usually achieved using Hall effect sensors. These sensors allow the position of the rotating field in the motor to be known precisely. However, when the rotational speed of the motor is high, the sensors become ineffective.

There are therefore brushless and sensorless motors. The method consists in measuring the current in the phases of the motor through a measuring resistor between the power stages and the stator windings. Thus, the voltage measurement across the terminals of the measuring resistor, corresponding to the image of the current in the phase of the motor, allows the position of the rotating field in the motor to be determined.

When the brushless motor requires high electrical powers, it is necessary to have low-resistance measuring resistors in order to limit the power dissipated in the latter.

The measuring resistors have a parasitic inductance of a few nanohenries, which implies that the voltage measured across the terminals of the measuring resistor does not exactly reflect the image of the current. Thus, for very low resistance values, the parasitic inductance becomes significant and distorts the measurement of the electric current. Moreover, a distorted measurement of the voltage results in poor synchronization of the motor and therefore random and not very robust speed control.

One solution consists in adding a differential filter to eliminate the component of the parasitic inductance. This solution has many drawbacks because the differential filter is configured with respect to a parasitic inductance value provided by the supplier of the measuring resistor. This value is based on a statistical dispersion and differs from one measuring resistor to another. It can also vary according to the temperature of the measuring resistor, but also over time.

There is therefore a need to know precisely and in real time the real value of the voltage generated by the inductive part of a measuring resistor present in an electronic circuit.

SUMMARY OF THE INVENTION

The invention therefore relates to a method for determining the voltage UL generated by the inductive part of a measuring resistor present in an electronic circuit comprising a signal generator, at least one stator winding connected to said signal generator and to said measuring resistor and a differential amplifier for the voltage across the terminals of the measuring resistor, said method comprising:
- a step of energizing the electronic circuit for a predetermined period of time t,
- a step of measuring the voltage UT across the terminals of the measuring resistor at the end of the energizing step,
- a step of determining the voltage UR generated by the resistive part of the measuring resistor at the end of the energizing step, and
- a step of determining the voltage UL generated by the inductive part of the measuring resistor as a function of the voltage UT and the voltage UR.

According to one embodiment of the invention, the voltage UR is determined according to the following formula:

$$UR = (RR * (VDC/LS) * t * K) + Z$$

where
- UR represents the voltage generated by the resistive part of the measuring resistor,
- RR represents the resistance of the resistive part of the measuring resistor,
- VDC represents the voltage transmitted by the signal generator,
- LS represents the inductance of the inductive part of the stator winding,
- t represents a period of time,
- K represents the gain factor of the differential amplifier, and
- Z is a constant.

Advantageously, the voltage UL generated by the inductive part of the measuring resistor is equal to the difference between the voltage UT and the voltage UR.

According to another embodiment of the invention, the period of time t is between 7 µs and 10 µs.

According to yet another embodiment of the invention, the method comprises an additional step of storing the values of voltage UL generated by the inductive part of the measuring resistor.

According to yet another embodiment of the invention, the voltage UL generated by the inductive part of the measuring resistor is determined for different conditions of use of the measuring resistor.

According to yet another embodiment of the invention, the method comprises an additional step of determining the parasitic inductance LR of the measuring resistor as a function of the voltage UL generated by the inductive part of the measuring resistor.

The invention also relates to the use of the method according to the invention for determining the voltage UL generated by the inductive part of a measuring resistor present in an electronic circuit of an electric motor.

The invention also relates to a control unit for a motor for implementing the method according to the invention so as to synchronize the motor, said motor comprising a signal generator, a rotor, a stator comprising three stator windings, each connected to the signal generator by a stator phase, each stator phase comprising a measuring resistor and two switches and at least one differential amplifier at the terminals of a measuring resistor.

An advantage of the present invention lies in the precise determination of the real voltage generated by the inductive part of a measuring resistor.

Yet another advantage of the present invention lies in the increase in the precision of measurement of the voltage generated by the resistive part of a measuring resistor.

Another advantage of the present invention lies in the increase in the performance and robustness of a motor control.

Yet another advantage of the present invention lies in the precise measurement of the voltage generated by the resistive part of a measuring resistor at lower cost.

BRIEF DESCRIPTION OF THE DRAWINGS

Other features and advantages of the invention will be better understood from reading the description that follows and with reference to the appended drawings, which are provided by way of non-limiting illustration.

FIG. 1 shows a diagram of an electronic circuit.

FIG. 2 shows an example of an electronic circuit of an electric motor.

DESCRIPTION OF THE EMBODIMENTS

As indicated above, the invention is based on determining the voltage generated by the inductive part of a measuring resistor included in an electronic circuit.

FIG. 1 shows an electronic circuit comprising a signal generator 1, a resistor 2, a coil or stator winding 3 and a differential amplifier 4 at the terminals of the measuring resistor 2. The resistor 2 is connected to the signal generator 1 and to the stator winding 3, which is itself connected to the signal generator 1.

The signal generator 1 is able to deliver a signal to the electronic circuit so as to energize the electronic circuit. The signal generator 1 according to the invention generates a DC voltage signal. According to one embodiment of the invention, the signal generator 1 delivers a DC voltage step VDC of known value for a known period of time t.

The stator winding 3 allows a current to be generated when it is energized. The stator winding 3 comprises a resistive part 7 of resistance RS and an inductive part 8 of known inductance LS.

The measuring resistor 2 comprises a resistive part 5 of known resistance RR and an inductive part 6 of inductance LR. The measuring resistor 2 is used to determine the voltage induced by the current in the electronic circuit and thus to allow an image of the current to be generated. Only the voltage UR generated by the resistive part 5 is useful in order to have the ideal image of the current. However, when the voltage UT across the terminals of the measuring resistor 2 is measured, this is the sum of the voltage UL generated by the inductive part 6 and the voltage UR generated by the resistive part 5 of the measuring resistor 2. It is therefore necessary to know the value of the voltage UL precisely so as to be able to generate an ideal image of the current flowing through the electronic circuit.

The measuring resistor 2 has a very low resistance value RR, of the order of mΩ. As a result, the value of the voltage UR across its terminals is very low. It is therefore necessary to amplify it before measuring it and therefore to have a differential amplifier 4 at the terminals of the measuring resistor 2. The differential amplifier 4 therefore amplifies the voltage UR by a gain factor K but also the voltage UL. The differential amplifier 4 also allows a constant Z to be added to the measured voltage UT so as to determine whether a positive or negative current is being dealt with.

In general and for reasons of clarity, the value of the amplified voltage across the terminals of the measuring resistor 2 will be called UT. In the same way, the value of amplified voltage generated by the inductive part 6 and the resistive part 5 of the measuring resistor 2 will be called UL and UR respectively.

The method according to the invention allows the voltage UL generated by the inductive part 6 of the measuring resistor 2 to be determined precisely and in real time. A first step consists in energizing the electronic circuit for a predetermined period of time t. This step is performed by activating the signal generator 1. According to one embodiment of the invention, the signal generator 1 delivers a voltage signal of value VDC. The period of time t depends on the parameters of the electronic circuit and its components and, in particular, on the inductance of the stator winding. According to one embodiment of the invention, the period of time t is generally between 7 μs and 10 μs.

Thus, at the end of the energizing step, the value VDC is known and also the period of time t. There follows a step of measuring the voltage UT across the terminals of the measuring resistor 2 so as to determine the value of the voltage UT at the time t. It will be noted that the value of the voltage UT at the time t can be determined according to the following formula:

$$U_T = \left(\left(\left(R_R * \frac{V_{DC}}{L_S} * t\right) + \left(L_R * \frac{d_i}{d_t}\right)\right) * K\right) + Z$$

where

RR represents the resistance of the resistive part of the measuring resistor,

VDC represents the voltage transmitted at the time t by the signal generator,

LS represents the inductance of the inductive part of the stator winding, t is a period of time, LR represents the inductance of the inductive part of the measuring resistor, i represents the intensity of the current, K represents the gain constant of the differential amplifier, and Z is a constant.

The next step of determining the voltage UR generated by the resistive part 5 of the measuring resistor 2 is also carried out at the end of the energizing step. According to one embodiment of the invention, the voltage UR at the time t is theoretically determined according to the following formula:

$$U_R = \left(\left(R_R * \frac{V_{DC}}{L_S} * t\right) * K\right) * Z$$

where

RR represents the resistance of the resistive part of the measuring resistor,

VDC represents the voltage transmitted at the time t by the signal generator,

LS represents the inductance of the inductive part of the stator winding, t is a period of time, K represents the gain constant of the differential amplifier, and Z is a constant.

Thus, the knowledge, at the time t, of the value of voltage UR generated by the resistive part 5 of the measuring resistor 2 and of the value of the voltage UT across the terminals of the measuring resistor 2 allows the value, at the time t, of the voltage UL generated by the inductive part 6 of the measuring resistor 2 to be determined.

According to one embodiment of the invention, the voltage UL generated by the inductive part 6 of the measuring resistor 2 is equal to the difference between the voltage UT and the voltage UR.

The method according to the invention moreover allows the voltage UL generated by the inductive part 6 of a measuring resistor 2 to be determined for multiple conditions of use. According to one embodiment of the invention, the voltage UL is determined for different temperature conditions but also according to the state of health of the measuring resistor 2.

According to one embodiment of the invention, the determined values of voltage UL are stored. The data can in particular be stored in the memory of a motor control unit. This allows a database of values of the voltage UL to be established for each measuring resistor 2, and for different conditions of use. Ultimately, it is possible to determine, in real time and precisely, from the real measurement of the voltage UT across the terminals of the measuring resistor 2, the voltage UR generated by the resistive part 5 of the measuring resistor 2, and for different conditions of use of the measuring resistor 2. It will be noted that the method according to the invention allows the voltage UR to be determined precisely and without a differential filter.

The method according to the invention also allows the inductance LR of the inductive part 6 of the measuring resistor 2 to be determined from the voltage UL generated by the inductive part 6 of the measuring resistor 2. Values of inductance LR are also stored so as to create a database.

The method according to the invention can in particular be used to determine the voltage UL generated by the inductive part 6 of a measuring resistor 2 present in an electronic circuit of an electric motor.

FIG. 2 shows an example of an electronic circuit of an electric motor. The electronic circuit comprises a signal generator 10, a rotor, a stator comprising three stator windings 11, 12 and 13. Each stator winding 11, 12 and 13 is connected to the signal generator 10 by a stator phase U, V and W respectively. Each stator phase U, V and W comprises a measuring resistor 14, 15 and 16 and two switches 14a and 14b, 15a and 15b and 16a and 16b respectively. The motor also comprises at least one differential amplifier 17 at the terminals of a measuring resistor 14, 15 or 16.

The motor also comprises a motor control unit (not shown in FIG. 2) for implementing the method according to the invention so as to synchronize the motor precisely.

The exact determination of the voltage UR generated by the resistive part of a measuring resistor 14, 15, 16 allows the position of the rotating field of the motor to be known precisely and therefore allows the motor to be synchronized precisely. The method according to the invention also allows the performance and robustness of the motor control to be increased.

The invention claimed is:

1. A method for determining voltage generated by an inductive part of a measuring resistor present in an electronic circuit including a signal generator, at least one stator winding connected to said signal generator and said measuring resistor, and a differential amplifier for the voltage across terminals of the measuring resistor, said method comprising:

energizing the electronic circuit for a predetermined period of time t;

measuring the voltage UT across the terminals of the measuring resistor at the end of the energizing;

determining the voltage UR generated by a resistive part of the measuring resistor at the end of the energizing based on the voltage VDC transmitted by the signal generator and the predetermined period of time; and determining the voltage UL generated by the inductive part of the measuring resistor as a function of the voltage UT and the voltage UR.

2. A method for determining voltage generated by an inductive part of a measuring resistor present in an electronic circuit including a signal generator, at least one stator winding connected to said signal generator and said measuring resistor, and a differential amplifier for the voltage across terminals of the measuring resistor, said method comprising:

energizing the electronic circuit for a predetermined period of time t;

measuring the voltage UT across the terminals of the measuring resistor at the end of the energizing;

determining the voltage UR generated by a resistive part of the measuring resistor at the end of the energizing; and determining the voltage UL generated by the inductive part of the measuring resistor as a function of the voltage UT and the voltage UR, wherein the voltage UR is determined according to the following formula:

$$UR=((RR*(VDC/LS)*t)*K)*Z$$

where

UR represents the voltage generated by the resistive part of the measuring resistor, RR represents the resistance of the resistive part of the measuring resistor, VDC represents the voltage transmitted by the signal generator, LS represents the inductance of the inductive part of the stator winding, t represents a period of time, K represents the gain factor of the differential amplifier, and Z is a constant.

3. The method as claimed in claim 1, wherein the voltage UL generated by the inductive part of the measuring resistor is equal to the difference between the voltage UT and the voltage UR.

4. The method as claimed in claim 1, wherein the period of time t is between 7 µs and 10 µs.

5. The method as claimed in claim 1, further comprising storing the values of voltage UL generated by the inductive part of the measuring resistor.

6. The method as claimed in claim 1, wherein the voltage UL generated by the inductive part of the measuring resistor is determined for different conditions of use of the measuring resistor.

7. The method as claimed in claim 1, further comprising determining the parasitic inductance LR of the measuring resistor as a function of the voltage UL generated by the inductive part of the measuring resistor.

8. The method as claimed in claim 1, wherein the electronic circuit is part of an electric motor.

9. A control unit for a motor configured to implement the method as claimed in claim 1 to synchronize the motor, said motor including a signal generator, a rotor, a stator including three stator windings, each connected to the signal generator by a stator phase, each stator phase including a measuring resistor and two switches and at least one differential amplifier at the terminals of a measuring resistor.

10. The method as claimed in claim 2, wherein the voltage UL generated by the inductive part of the measuring resistor is equal to the difference between the voltage UT and the voltage UR.

11. The method as claimed in claim 2, wherein the period of time t is between 7 μs and 10 μs.

12. The method as claimed in claim 3, wherein the period of time t is between 7 μs and 10 μs.

13. The method as claimed in claim 2, further comprising storing the values of voltage UL generated by the inductive part of the measuring resistor.

14. The method as claimed in claim 3, further comprising storing the values of voltage UL generated by the inductive part of the measuring resistor.

15. The method as claimed in claim 4, further comprising storing the values of voltage UL generated by the inductive part of the measuring resistor.

16. The method as claimed in claim 2, wherein the voltage UL generated by the inductive part of the measuring resistor is determined for different conditions of use of the measuring resistor.

17. The method as claimed in claim 3, wherein the voltage UL generated by the inductive part of the measuring resistor is determined for different conditions of use of the measuring resistor.

18. The method as claimed in claim 4, wherein the voltage UL generated by the inductive part of the measuring resistor is determined for different conditions of use of the measuring resistor.

19. The method as claimed in claim 5, wherein the voltage UL generated by the inductive part of the measuring resistor is determined for different conditions of use of the measuring resistor.

20. The method as claimed in claim 2, further comprising determining the parasitic inductance LR of the measuring resistor as a function of the voltage UL generated by the inductive part of the measuring resistor.

\* \* \* \* \*